united States Patent [19]
Sands et al.

[11] Patent Number: 6,061,237
[45] Date of Patent: May 9, 2000

[54] COMPUTER WITH AN IMPROVED COOLING SYSTEM AND A METHOD FOR COOLING A COMPUTER

[75] Inventors: Steve Sands, Austin; Andrew L. McAnally, Georgetown; R. Steven Mills, Austin, all of Tex.

[73] Assignee: Dell USA, L.P., Round Rock, Tex.

[21] Appl. No.: 09/217,216

[22] Filed: Dec. 21, 1998

[51] Int. Cl.[7] .................................................. H05K 7/20
[52] U.S. Cl. ........................ 361/695; 361/687; 361/692; 361/694; 361/717; 361/697; 361/775; 257/717; 257/719; 257/727; 164/80.3; 164/121; 164/104.33; 164/185; 454/184; 307/112; 307/125; 312/107; 312/111
[58] Field of Search ................................... 361/687, 690, 361/694, 695, 717–719, 720–722, 775, 697, 714; 165/80.2, 80.3, 104.34, 185, 121–126, 104.33; 257/727, 713, 721, 722, 717–719; 174/16 R, 252; 340/635, 648, 504, 621; 454/184; 307/125, 112, 116, 117, 139; 388/939; 312/107, 111, 257.1, 236, 323.3

[56] References Cited

U.S. PATENT DOCUMENTS

| | | |
|---|---|---|
| 4,137,057 | 1/1979 | Piet et al. . |
| 4,751,872 | 6/1988 | Lawson ........................................ 98/1 |
| 5,136,465 | 8/1992 | Benck et al. . |
| 5,168,424 | 12/1992 | Bolton et al. . |
| 5,339,214 | 8/1994 | Nelson . |
| 5,438,226 | 8/1995 | Kuchta ..................................... 307/125 |
| 5,440,450 | 8/1995 | Lau et al. ................................ 361/695 |
| 5,505,533 | 4/1996 | Kammersqard et al. ............... 312/107 |
| 5,526,875 | 6/1996 | Lin . |
| 5,528,454 | 6/1996 | Niklos . |
| 5,546,272 | 8/1996 | Moss et al. . |
| 5,638,895 | 6/1997 | Dodson . |
| 5,707,282 | 1/1998 | Clements et al. ....................... 454/184 |
| 5,745,041 | 4/1998 | Moss ...................................... 340/635 |
| 5,787,971 | 8/1998 | Dodson . |
| 5,793,608 | 8/1998 | Winick et al. .......................... 361/695 |
| 5,822,188 | 10/1998 | Bullington .............................. 361/695 |
| 5,871,396 | 2/1999 | Shen ...................................... 454/184 |
| 5,936,836 | 8/1999 | Scholder ................................ 361/695 |
| 6,005,770 | 12/1999 | Schmitt ................................. 361/695 |

Primary Examiner—Leo P. Picard
Assistant Examiner—Michael Datskovsky
Attorney, Agent, or Firm—Haynes & Boone, L.L.P.

[57] ABSTRACT

A computer, or electronic device, according to which two fans are mounted on a mounting member which, in turn, is mounted to a wall of the chassis of the computer or component so that the fans establish an air flow in the chassis in a predetermined direction. The fans are mounted to the mounting member, and the mounting member is mounted to the wall, in a manner so that the fans extend at an angle to the wall and so that the space occupied by the fans is less than the space that the fans would occupy when mounted in a side-by-side relation and parallel to the wall. The fans are also positioned so that, if one fails, the other will cool the components normally cooled by the failed fan.

34 Claims, 2 Drawing Sheets

COMPUTER WITH AN IMPROVED COOLING SYSTEM AND A METHOD FOR COOLING A COMPUTER

BACKGROUND

The present disclosure relates, in general, to a computer, or other similar electronic device, and, more particularly, to such a computer and method according to which an internal fan assembly is provided for cooling the interior of the computer.

As computers, such as central processing units, servers, and other similar types of electronic devices grow in speed and capacity, power consumed within the system per unit volume (power density) increases dramatically. Thus, it becomes essential to dissipate the heat generated by components within the system during operation to ensure that the components remain within their normal operating temperature ranges since, otherwise, the components will fail immediately or will have too short a lifetime.

In large systems employing one or more computers with very large capacity, memory and speed, the computers are often manufactured in sub assemblies which are manufactured and/or assembled separately, yet function together. An example of this type of subassembly is a processor subassembly which consists of a bank of several relatively large processors, all mounted in the same dedicated subchassis which, in turn, may be mounted in a larger chassis, or on a rack mount, or the like, along with other basic components to form a computer.

One of the most effective techniques of dissipating heat from a computer, a sub-assembly of the above type, or a similar type of electronic device, is to provide an internal fan, or fan assembly, to directly apply a relatively high-velocity air across the surface of the internal components to force cool the components. This raises the convective heat transfer coefficient for the surface of the internal components, thereby increasing the convection cooling.

Although a fan-based system provides effective cooling, it has drawbacks. For example, in relatively large systems, a standard sized fan does not have the capacity to cool the internal components. Also, if the fan fails or locks up, there is no way to cool the components of the computer because there is usually no back-up capability, and, even if so, the components normally cooled by the failed fan would not be cooled. Thus, in all of the above situations, the components may overheat causing them to malfunction and the computer to fail.

A viable solution to overcome the above problems is to incorporate a secondary, or redundant, fan which is usually designed to run continuously with the primary fan while the computer is in operation. This secondary fan has the advantage of offering additional cooling while simultaneously fulfilling the ultimate objective for implementing the other fan.

However, in these arrangements, the mounting of both the primary and redundant fans to the chassis of the computer or of the subassembly discussed above is difficult since, if mounted in a conventional manner, they obviously would take up twice the space in the chassis or along a chassis wall. Also, even if two fans are provided and one fails, the components normally cooled by the failed fan would not be cooled.

Accordingly, what is needed is a computer, a subassembly of the above type, or other similar type of electronic device, incorporating an internal fan assembly consisting of two or move individual fans that can be installed in the chassis of the computer, the subassembly, or the device without taking up double the space of a single fan. Also needed is an arrangement of the above type according to which the fans are positioned so that, if one fails, the other fan will cool the components normally cooled by the failed fan.

SUMMARY

To this end, according to an embodiment of the invention, a computer, a subassembly, or other similar type of electronic device, is provided according to which two fans are mounted on a mounting member which, in turn, is mounted to a wall of the chassis of the computer, subassembly or device so that the fans establish an air flow in the chassis in a predetermined direction. The fans are mounted to the mounting member, and the mounting member is mounted to the wall, in a manner so that the fans extend at an angle to the wall and so that the space occupied by the fans is less than the space that the fans would occupy when mounted in a side-by-side relation and parallel to the wall. The fans are also positioned so that, if one fails, the other will cool the components normally cooled by the failed fan.

Significant advantages are achieved with the above embodiment since the fan assembly is easily and quickly installed to the chassis yet takes up less space that two individual fans mounted in a normal manner. Also, the fan assembly can be easily and quickly removed from the chassis for repair or replacement. Further, if one of the fans fails, the other fan will cool the components normally cooled by the failed fan.

DETAILED DESCRIPTION OF THE PREFERRED EMBODIMENT

Figure 1:
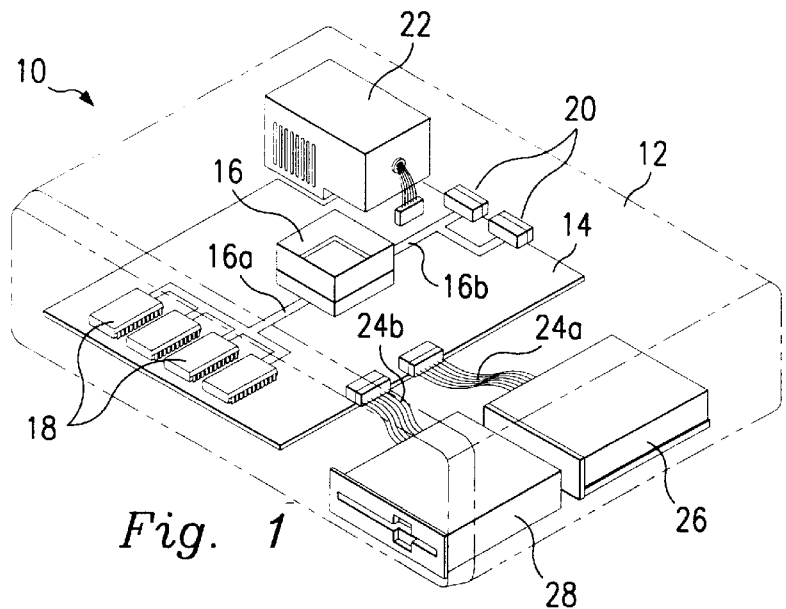
FIG. 1 is a diagrammatic view of a computer according to an embodiment of the present invention.

An embodiment of the present invention is shown in FIG. 1 in connection with a computer, referred to, in general, by the reference numeral 10, which can be in the form of a server, a tower computer, a desktop computer, or the like. The computer 10 includes a chassis 12 in which a motherboard 14 is mounted. A subassembly 16, to be described in detail later, is mounted in the chassis 12 in any known manner and contains a plurality of processors which are connected to the motherboard 14. A plurality of memory devices, or modules, 18 and two input/output (I/O) devices 20 are mounted on the motherboard 14. Two buses 16a and 16b are also provided on the motherboard 14 and connect the processors in the subassembly 16 to the memory modules 18 and to the input/output devices 20, respectively. A power supply 22 is connected to the motherboard 14, and a pair of cable assemblies 24a and 24b connect the motherboard to a hard drive unit 26 and a disk drive unit 28, respectively. It is understood that other components, electrical traces, electrical circuits and related devices (not shown) are provided in the chassis 12. Since these are all conventional, they will not be described in any further detail.

Figure 2:
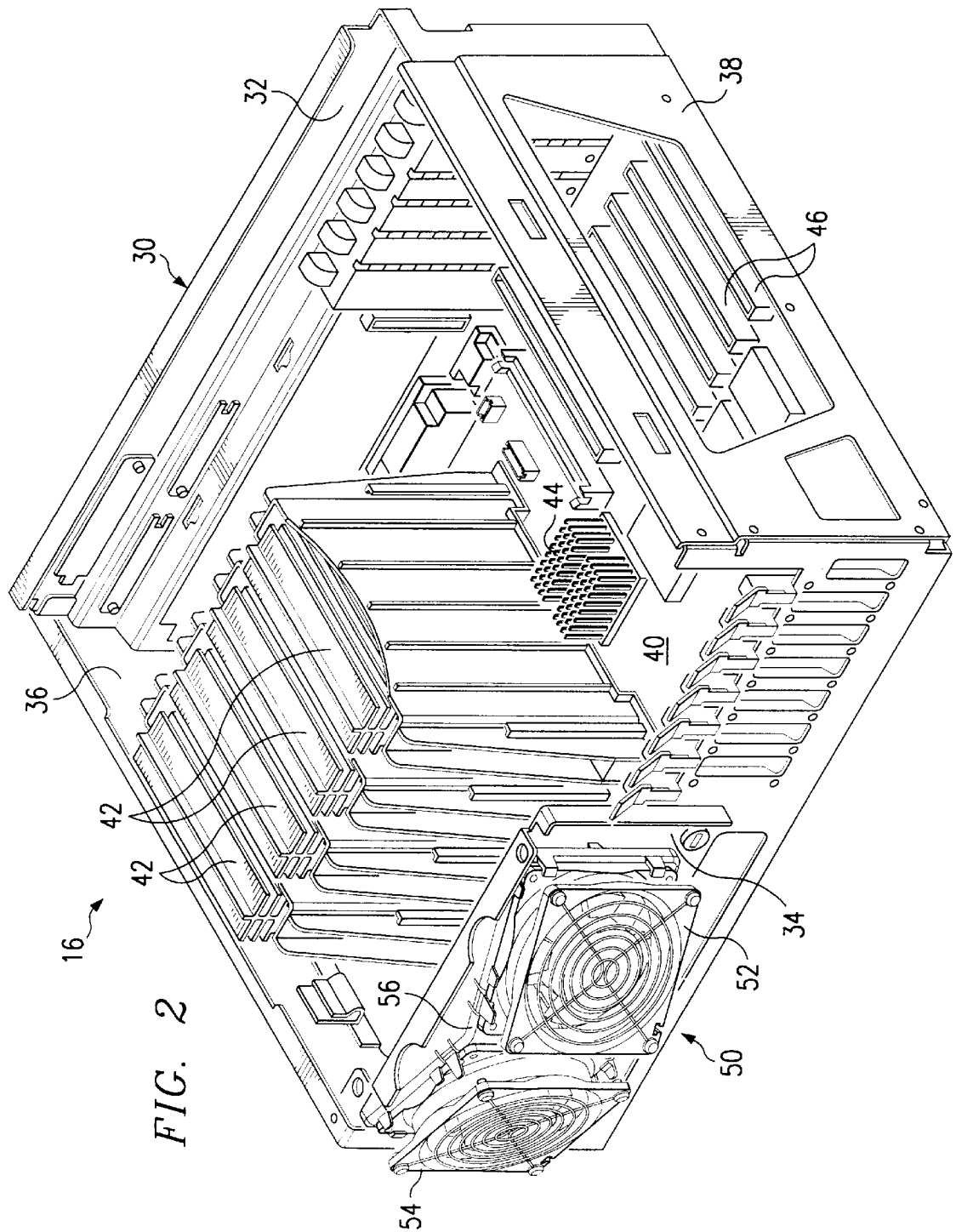
FIG. 2 is an enlarged, isometric view of a subassembly of the computer of FIG. 1.

The subassembly 16 is shown in FIG. 2 and includes a chassis 30 having a front wall 32, a rear wall 34, two side walls 36 and 38, and a bottom plate (not shown) all formed and connected in a conventional manner.

A mother board 40 is disposed in the chassis 30 and a bank of processors 42 are mounted on the mother board 40 in any known manner, and extend parallel to the side walls 36 and 38. A processor 42 at one end of the bank of processors extends adjacent the side wall 36 and the processor at the other end of the bank extends adjacent to a memory and processor control chip 44 which is also mounted to the mother board. A plurality of connectors 46 are also mounted on the mother board 40 for receiving circuit boards, cards, and the like. It is understood that additional components, buses, electrical traces, electrical circuits and related devices (not shown) are provided in the chassis 30 but are not shown in the interest of clarity and since they, per se, do not form any part of any embodiment of the present invention.

A fan assembly 50 is connected to the rear wall 34 in a manner to be described and includes two fans 52 and 54 mounted to a mounting bracket 56.

Figure 3:
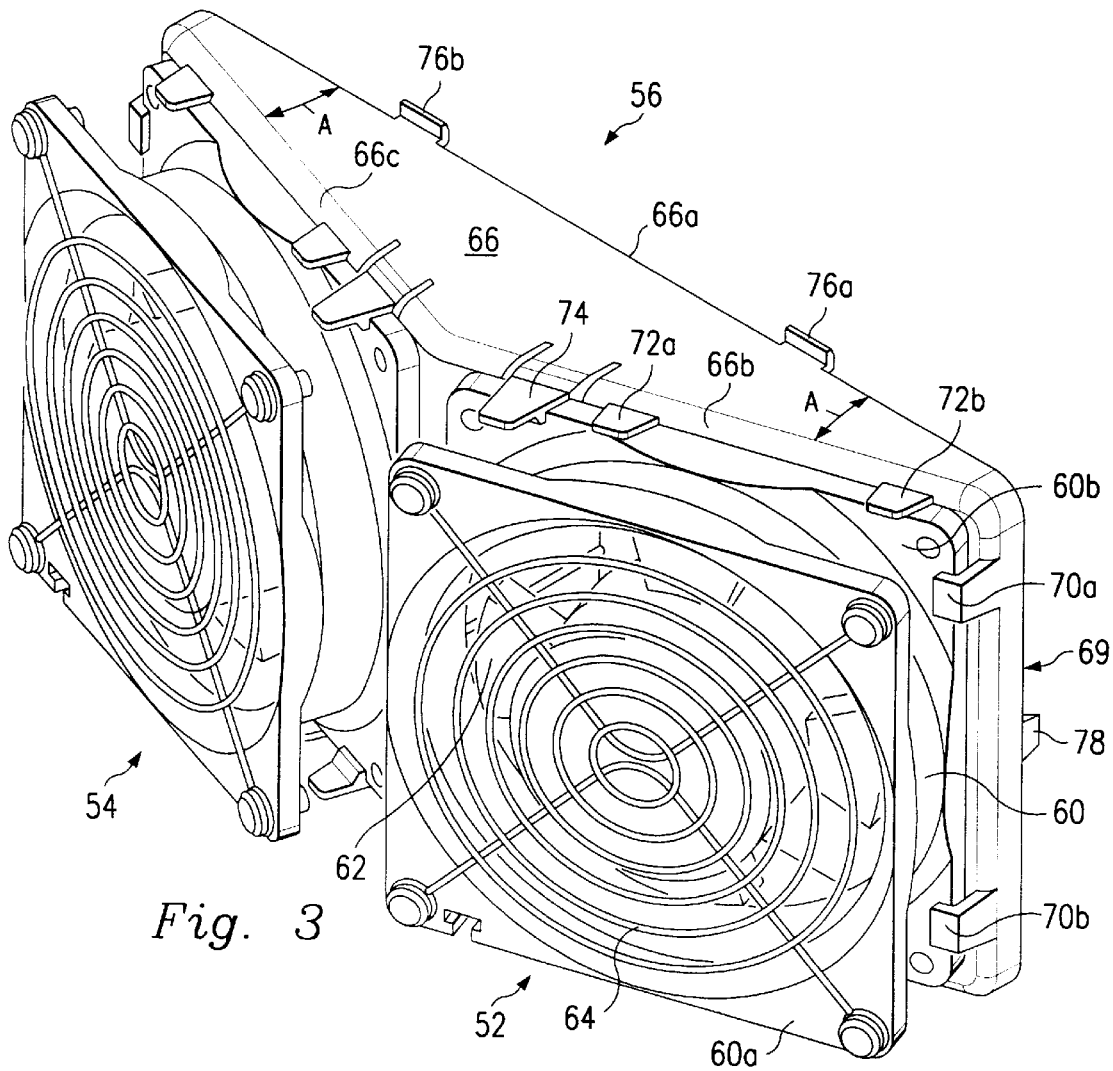
FIG. 3 is an enlarged, isometric view of the fan assembly of the subassembly of FIG. 2.

As better shown in FIG. 3, the fan 52 includes an open-ended housing 60 having a circular cross-section, a propeller 62 mounted for rotation in the housing, and a motor (not shown) for driving the propeller. Two rectangular flanges 60a and 60b extend from the inlet end and the outlet end, respectively, of the housing 60, and a finger guard 64 is mounted over the flange 60a. Since the fan 52 is conventional it will not be described in any further detail.

The bracket 56 is substantially rectangular in vertical cross-section and has a top plate 66, a mother board(not shown) and two side walls, one of which is shown and referred to by the reference numeral 68, all of which define a rectangular opening. The top plate has a straight back edge portion 66a and two front edge portions 66b and 66c each of which extends at an angle A to the back edge portion. The angle A can vary and, in the example shown in FIG. 3, is approximately 15 degrees. Although not shown in the drawings, it is understood that the mother board of the bracket 56 is identical to the top plate 66.

The two front edge portion 66b and 66c of the top plate 66 and the corresponding edge portions (not shown) of the bottom plate define mounting surfaces for the fan 52. In its mounted position on the bracket 66, the fan 52 is oriented in an upright, vertical position with the rear surface of the flange 60b, as viewed in FIG. 3, abutting the edge portion 66b of the plate 66 and with the corresponding front edge portion of the above-mentioned bottom plate. As a result, the fan 52 extends at the angle A.

A pair of hook tabs 70a and 70b extend from the side wall 68 of the bracket 56, and a pair of guide tabs 72a and 72b extend from the top plate 66. Thus, the fan 52 can be positioned below the bracket 56 as viewed in FIG. 3 in alignment with the hook tabs 70a and 70b and then moved upwardly relative to the bracket 56 until the upper edge of the flange 60a of the fan housing 60 engages the guide tabs 72a and 72b to position the fan relative to the bracket. A flexible tab 74 also extends from the top plate 66 and is adapted to snap over the upper surface of the flange 60a of the fan 52 to secure the fan to the bracket 56.

It is understood that the fan 54 is mounted to the edge portion 66c of the plate 66 and the corresponding edge portion of the above-mentioned mother board in an identical manner.

Two tabs 76a and 76b extend from the edge portion 66a of the top plate 66 and a tab 78 extends from the rear surface of the side wall 68. It is understood that another tab (not shown), identical to the tab 78, extends from the other side wall of the bracket 56. This enables the fan assembly 56, with the fans 52 and 54 mounted on the bracket 56 as discussed above, to be mounted relative to the rear wall 34 of the chassis 30 as shown in FIG. 2. More particularly, slots, or keepers, (not shown) are provided in the wall 34 to receive the tabs 76a, 76b and 78 and the tab extending from the above-mentioned other side wall of the bracket. Thus, the bracket 56, with the fans 52 and 54 can easily be quick-detachably mounted and dismounted from the wall 34.

Due to the angular orientation of the front edge portions 66b and 66c of the plate 66 and the corresponding front edge portions of the corresponding bottom plate, the fans 52 and 54 extend at an angle, corresponding to angle A, to the wall 34 and thus take up less space along the wall than they would if simply mounted in a side-by-side relation and parallel to the wall.

When the fan assembly 30 is installed to the wall 34 of the chassis 30 in the manner describe above, and as shown in FIG. 2, the fans 52 and 54 are designed to force ambient air across the processors 42. This raises the convective heat transfer coefficient for the surface of the processors 42, thereby increasing their convection cooling. In this context, it is understood that the fans 52 and 54 can also be adapted to pull air from the interior of the chassis 30 and across the processors 42 to achieve the same result.

Do to the angular orientation of the fans 52 or 54, if one of the fans fails, the other fan will cool the processors 42 normally cooled by the failed fan. Also, if either of the fans 52 or 54 need to be serviced or replaced, the assembly 50 is easily removed from the chassis 30 by simple disengaging the tabs 76a, 76b and 78 and the tab extending from the above-mentioned other side wall of the bracket, with their corresponding slots, or keepers and removing the bracket 56, and therefore the fans 52 and 54.

As a result of the foregoing, a distinct advantage is obtained by the system and method of the present disclosure since the fans 52 and 54 take up less space along the wall 34 than they would if simply mounted to the wall in a side-by-side manner. Also, if one of the fans 52 or 54 fails, the other fan will cool the components normally cooled by the failed fan. Further, the fan assembly 50 can be easily installed and removed from the chassis 30 in a manner to insure that the fans will be properly oriented in the chassis.

It is understood that variations may be made in the foregoing without departing from the scope of the present disclosure. For example, the angle A can be varied and can be much higher than the above example so that the fans 52 and 54 would occupy even less space along the wall 34. It is also understood that the term "computer" is used in its broadest sense and is meant to include all types of computing systems including, but not limited to, laptop computers, central process units, towers, file servers, etc. Further, the present invention is not limited to computers, but is equally applicable to other electronic devices that generate heat during use.

Other modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the disclosure.

What is claimed is:

1. A computer comprising at least one chassis having at least one wall, memory disposed in the chassis, a mounting member, at least two fans mounted on the mounting member, the fans being mounted to the mounting member, and the mounting member being mounted to the wall, in a manner so that the fans extend at an acute angle to the wall and so that the space occupied by the fans is less than the space that the fans would occupy when mounted in a side-by-side relation and parallel to the wall, the fans adapted to flow air through the chassis.

2. The computer of claim 1 further comprising components disposed in the chassis, the fans being directed towards the components for establishing an air flow towards the components for cooling same, and wherein the fans are positioned so that, if one fan fails, the other fan will cool the components normally cooled by the failed fan.

3. The computer of claim 2 further comprising an additional chassis containing the first-mentioned chassis, and storage disposed in the additional chassis.

4. The computer of claim 1 wherein the mounting member defines mounting surfaces that extend at the angle to the wall, the fans being mounted on the mounting surfaces so that they each extend at the angle to the wall.

5. The computer of claim 1 further comprising a plurality of tabs formed on the mounting member for engaging the fans to secure the fans to the mounting member.

6. The computer of claim 1 further comprising a plurality of guide tabs formed on the mounting member for guiding the fans relative to the mounting member.

7. The computer of claim 1 further comprising at least one tab formed on the mounting member for engaging the wall to secure the mounting member to the wall.

8. A cooling system for an electronic device having at least one chassis having at least one wall; the cooling system comprising a mounting member, two fans mounted on the mounting member for establishing an air flow in the chassis in a predetermined direction, the fans being mounted to the mounting member, and the mounting member being mounted to the wall, in a manner so that the fans extend at an acute angle to the wall and so that the space occupied by the fans is less than the space that the fans would occupy when mounted in a side-by-side relation and parallel to the wall.

9. The system of claim 8 further comprising components disposed in the chassis, the fans being directed towards the components for establishing an air flow towards the components for cooling same, and wherein the fans are positioned so that, if one fan fails, the other fan will cool the components normally cooled by the failed fan.

10. The system of claim 9 further comprising an additional chassis containing the first-mentioned chassis, and memory and storage disposed in the additional chassis.

11. The system of claim 8 wherein the mounting member defines mounting surfaces that extend at the angle to the wall, the fans being mounted on the mounting surfaces so that they each extend at the angle to the wall.

12. The system of claim 8 further comprising a plurality of tabs formed on the mounting member for engaging the fans to secure the fans to the mounting member.

13. The system of claim 8 further comprising a plurality of guide tabs formed on the mounting member for guiding the fans relative to the mounting member.

14. The system of claim 8 further comprising at least one tab formed on the mounting member for engaging the wall to secure the mounting member to the wall.

15. A method for establishing air flow in a chassis of an electronic device, comprising the steps of mounting two fans on a mounting member, mounting the mounting member to a wall of the chassis so that the fans establish an air flow in the chassis in a predetermined direction, the fans being mounted to the mounting member, and the mounting member being mounted to the wall, in a manner so that the fans extend at an acute angle to the wall and so that the space occupied by the fans is less than the space that the fans would occupy when mounted in a side-by-side relation and parallel to the wall.

16. The method of claim 15 further comprising the steps of directing the air towards components in the chassis for establishing an air flow towards the components for cooling same, and positioning the fans so that, if one fan fails, the other fan will cool the components normally cooled by the failed fan.

17. The method of claim 15 further comprising the steps of forming mounting surfaces on the mounting member that extend at the angle to the wall, and mounting the fans on the mounting surfaces so that they each extend at the angle to the wall.

18. The method of claim 15 further comprising the step of engaging the fans with a plurality of tabs on the mounting member to secure the fan to the mounting member.

19. The method of claim 15 further comprising the step of guiding the fan relative to the mounting member.

20. The method of claim 15 further comprising the step of engaging the wall with a plurality of tabs on the mounting member to secure the mounting member to the wall.

21. A computer comprising a chassis; and at least one subassembly disposed in the chassis, the subassembly comprising at least one wall defining a space for containing at least one heat-generating member, a mounting member, and two fans mounted on the mounting member for establishing an air flow in the subassembly towards the member, the fans being mounted to the mounting member, and the mounting member being mounted to the wall, in a manner so that the fans extend at an acute angle to the wall and so that the space occupied by the fans is less than the space that the fans would occupy when mounted in a side-by-side relation and parallel to the wall.

22. The computer of claim 21 wherein the fans are directed towards the heat generating members for establishing an air flow towards the members for cooling same, and wherein the fans are positioned so that, if one fan fails, the other fan will cool the members normally cooled by the failed fan.

23. The computer of claim 21 wherein the mounting member defines mounting surfaces that extend at the angle to the wall, the fans being mounted on the mounting surfaces so that they each extend at the angle to the wall.

24. The computer of claim 21 further comprising a plurality of tabs formed on the mounting member for engaging the fans to secure the fans to the mounting member.

25. The computer of claim 21 further comprising a plurality of guide tabs formed on the mounting member for guiding the fans relative to the mounting member.

26. The computer of claim 21 further comprising at least one tab formed on the mounting member for engaging the wall to secure the mounting member to the wall.

27. A cooling system for an electronic device having at least one chassis having at least one wall and containing components; the cooling system comprising a mounting member, wherein the mounting member defines mounting surfaces that extend at an acute angle to the wall, and two fans mounted on the mounting surfaces so that they each extend at the angle to the wall for establishing an air flow in the chassis towards the components for cooling the same, the fans being mounted to the mounting member, and the mounting member being mounted to the wall, in a manner so that, if one fan fails, the other fan will cool the components normally cooled by the failed fan.

28. The system of claim 27 further comprising an additional chassis containing the first-mentioned chassis, and memory and storage disposed in the additional chassis.

29. The system of claim 27 further comprising a plurality of tabs formed on the mounting member for engaging the fans to secure the fans to the mounting member.

30. The system of claim 27 further comprising at least one tab formed on the mounting member for engaging the wall to secure the mounting member to the wall.

31. A method for establishing air flow in a chassis of an electronic device containing components, comprising the steps of forming mounting surfaces on a mounting member that extends at an acute angle to a chassis wall, mounting two fans on the mounting surfaces so that they each extend at the angle to the wall of the chassis such that the fans establish an air flow in the chassis, and positioning the fans so that the fans establish an air flow towards the components for cooling the same, and so that, if one fan fails, the other fan will cool the components normally cooled by the failed fan.

32. The method of claim 31 wherein the step of mounting comprises the steps of mounting the two fans on a mounting member, and mounting the mounting member to the wall.

33. The method of claim 32 further comprising the step of engaging the fans with a plurality of tabs on the mounting member to secure the fan to the mounting member.

34. The method of claim 32 further comprising the step of engaging the wall with a plurality of tabs on the mounting member to secure the mounting member to the wall.

* * * * *